(12) United States Patent
Huang

(10) Patent No.: US 7,519,436 B2
(45) Date of Patent: Apr. 14, 2009

(54) BUTTON DEVICE

(75) Inventor: Wei-Chih Huang, Taipei (TW)

(73) Assignee: Princeton Technology Corporation, Taipei (TW)

( * ) Notice: Subject to any disclaimer, the term of this patent is extended or adjusted under 35 U.S.C. 154(b) by 377 days.

(21) Appl. No.: 11/416,187

(22) Filed: May 3, 2006

(65) Prior Publication Data

US 2007/0021846 A1 Jan. 25, 2007

(30) Foreign Application Priority Data

Jul. 22, 2005 (TW) .............................. 94124930 A

(51) Int. Cl.
*G05B 15/02* (2006.01)
*G05B 19/18* (2006.01)

(52) U.S. Cl. .............................. 700/12; 700/9; 463/36; 463/37

(58) Field of Classification Search .................... 700/9, 700/12; 463/36–37
See application file for complete search history.

(56) References Cited

U.S. PATENT DOCUMENTS 5,632,680 A * 5/1997 Chung ........................ 463/36
5,777,904 A * 7/1998 Schneider ................... 708/141
6,512,508 B2 * 1/2003 Harrow et al. .............. 345/161

\* cited by examiner

*Primary Examiner*—Michael D Masinick
(74) *Attorney, Agent, or Firm*—Muncy, Geissler, Olds & Lowe, PLLC

(57) ABSTRACT

A button device comprising a voltage source and a plurality of buttons is provided. The button device further comprises: a charging module, a loading capacitor, a control module, and an MCU. The charging module provides a plurality of charging paths. At least one charging path is connected when at least one button is pressed. The loading capacitor coupled to the charging module obtains the electric power from the connected charging path to generate a charged signal. The control module sends a control signal through a connected control capacitor when the button is pressed to generate the control signal. The MCU receives the control signal to calculate a charging time and determines which button is pressed according to the charging time. The MCU stops calculating the charging time when the charged signal reaches a first predetermined voltage. Each charging path corresponds to different charging time.

6 Claims, 6 Drawing Sheets

BUTTON DEVICE

BACKGROUND OF THE INVENTION

1. Field of the Invention

The present invention relates to an electronic device, and in particular relates to a button device.

2. Description of the Related Art

Please refer to FIG. 1. FIG. 1 shows a schematic diagram of a first related button device 100. The button device 100 comprises a MCU 110, a plurality of pins 121, 122, 123 and 124, and a plurality of buttons 131, 132, 133 and 134. As shown in figure, the buttons 131,132,133 and 134 are coupled to the MCU 110 respectively through the pins 121, 122, 123 and 124. When a user presses the button 131, the electric signal on pin 121 changes. The MCU 110 can detect that the button 131 is pressed according to the electric signal from pin 121 and performs corresponding action. From the above description we know that the button device 100 needs to reserve a pin number at least equal to the button number. In other words, if there are N buttons on the button device, the MCU needs to reserve N pins for the buttons. Ideally, the pin number of the MCU is not limited. However, the more pins, the larger the required chip area.

Please refer to FIG. 2. FIG. 2 shows a schematic diagram of a second related button device 200. The button device 200 comprises a MCU 210, a plurality of pins 221, 222, 223, 224, 225 and 226, and a plurality of buttons 231, 232, 233, 234, 235, 236, 237, 238 and 239. The connection of each pin is provided as follows:

pin 221 is connected to a terminal of the buttons 231,232, 233;

pin 222 is connected to a terminal of the button 234,235, 236;

pin 223 is connected to a terminal of the button 237,238, 239;

pin 224 is connected to another terminal of the buttons 231,234,237;

pin 225 is connected to another terminal of the buttons 232,235,238;

pin 226 is connected to another terminal of the buttons 233,236,239.

The pins 221,222,223 are utilized to send the enabling signals to the coupled buttons. For example, when a user presses the button 231, the pin 221 sends the enabling signal to the button 231 and the MCU 210 can detect that the button 231 is pressed through the pin 224 connected to the button 231. From the above description it can be seen that the button device 200 only needs to reserve six pins even though it has nine buttons. The relationship between the pin number N and the button number M changes with various designs. Generally, the pin number N is designed to be less than the button number M. Compared with the first related button device 100, in a predetermined button number, the button device 200 utilizes less pins. This kind of architecture is commonly seen in remote controllers.

Please refer to FIG. 3. FIG. 3 shows a schematic diagram of a third related button device 300. The button device 300 comprises a MCU 310, a plurality of pins 321 and 322, an analog-to-digital converter (ADC) 340, and a plurality of buttons 331,332,333, and 334. The input terminal of ADC 340 is coupled to the plurality of buttons 331,332,333, and 334 and the output terminal of the ADC 340 is coupled to the plurality of pins 321 and 322. Since the resistances of the resistors connected to buttons are different (e.g. R, 2R, 4R, 6R), the corresponding voltage levels sent to the input terminal are different when different buttons are pressed. As shown in the figure, four different buttons map to four different voltage levels and the required pin number of the ADC 330 is equal to the value $\log_2 4=2$. From the description we know that the button device 300 needs to reserve a pin number at least equal to the value $\log_2 N$ if there are N buttons. Compared with the first and second related button devices 100 and 200, the greater the desired button numbers, the more the number of pin can be reduced. The ADC, however, is expensive and occupies a large area.

Please refer to FIG. 4. FIG. 4 shows a schematic diagram of a fourth related button device 400. The button device 400 comprises a control unit 410. The operation of the control unit 410 similar to the button device 300 is to detect buttons according to different voltage levels, however, it suffers from the same disadvantage of chip area and cost. A detailed description is provided in the Taiwan patent number I226731. Further discussion is omitted for the sake of brevity.

BRIEF SUMMARY OF THE INVENTION

A detailed description is given in the following embodiments with reference to the accompanying drawings.

A button device comprising a voltage source and a plurality of buttons is provided. The voltage source is connected to a terminal of each button for providing electric power. The button device further comprises: a charging module, a loading capacitor, a control module, and an MCU. The charging module comprises a plurality of charging resistors respectively coupled to another terminal of each button for providing a plurality of charging paths. At least one charging path is connected when at least one button is pressed. The loading capacitor coupled to the charging module obtains electric power from the connected charging path to generate a charged signal. The control module comprises a plurality of control capacitors for sending a control signal through a connected control capacitor when the button is pressed to generate the control signal. The MCU receives the control signal to calculate a charging time and determines which button is pressed according to the charging time. The MCU stops calculating the charging time when the charged signal reaches a first predetermined voltage. Each charging resistor has a different resistance corresponding to a different charging time.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
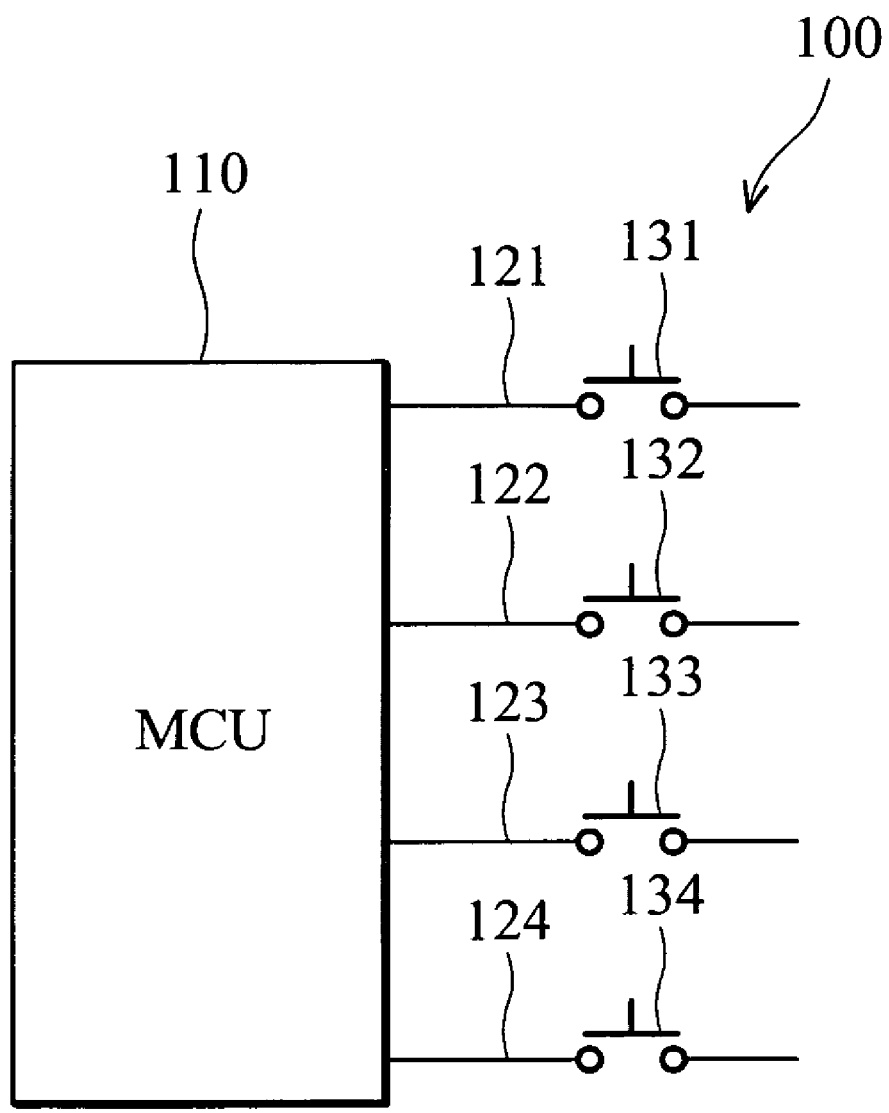
FIG. 1 shows a schematic diagram of a first related button device.
Figure 2:
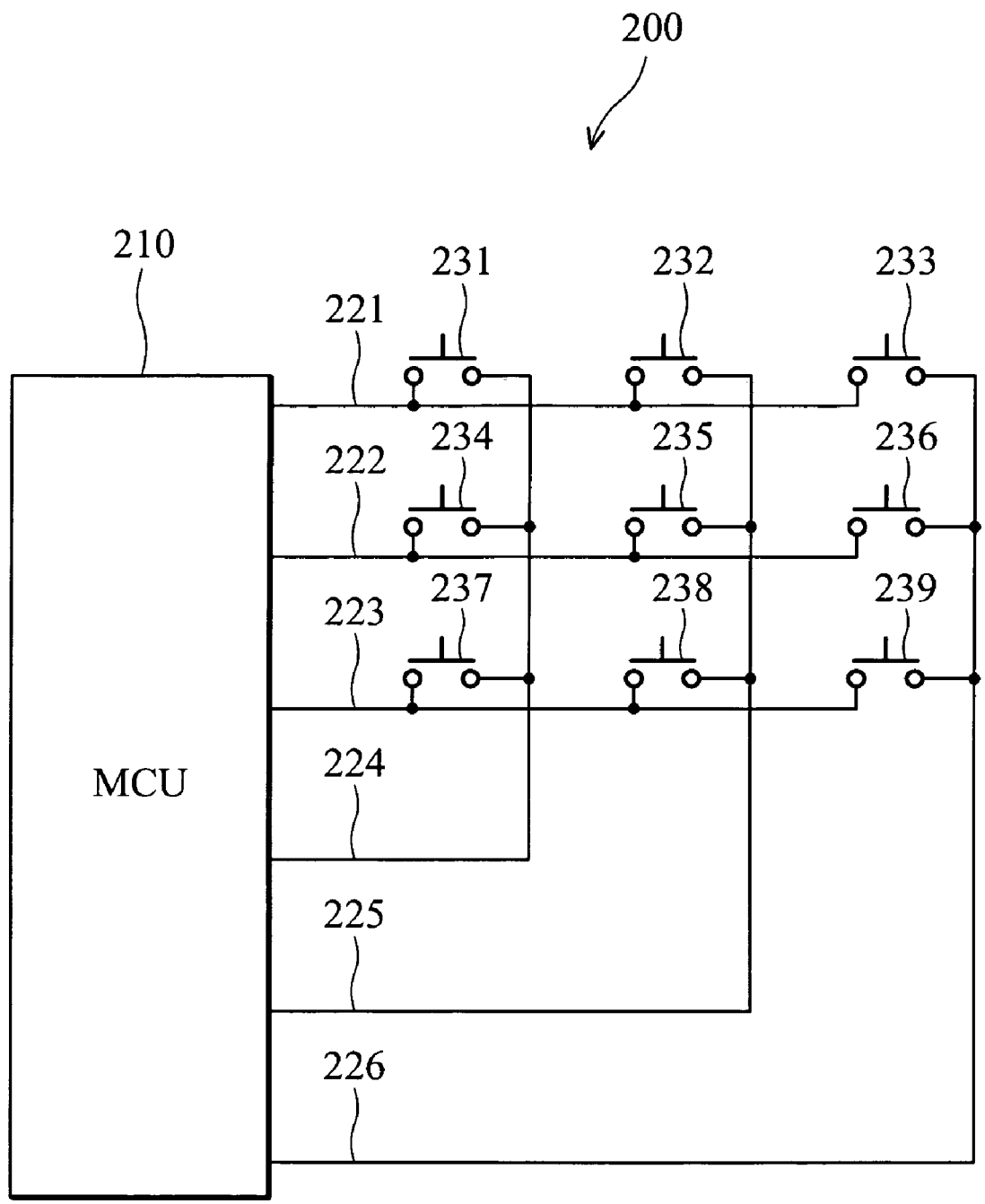
FIG. 2 shows a schematic diagram of a second related button device.
Figure 3:
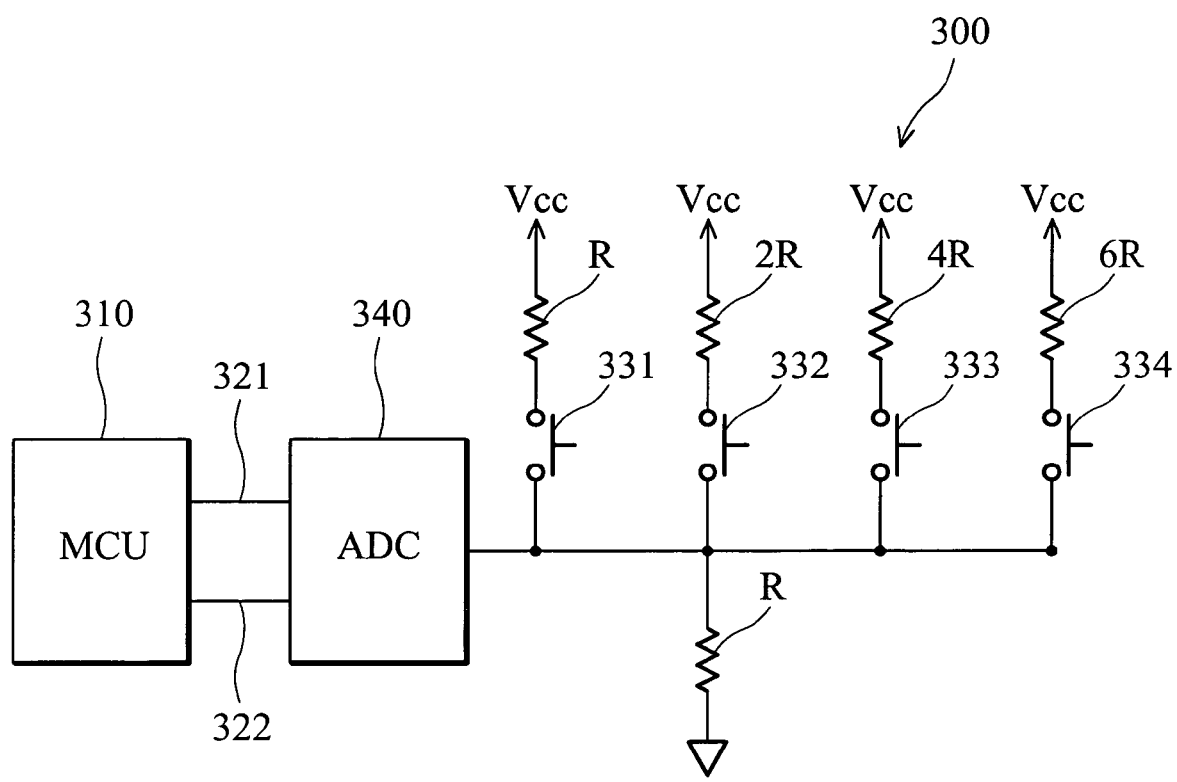
FIG. 3 shows a schematic diagram of a third related button device.
Figure 4:
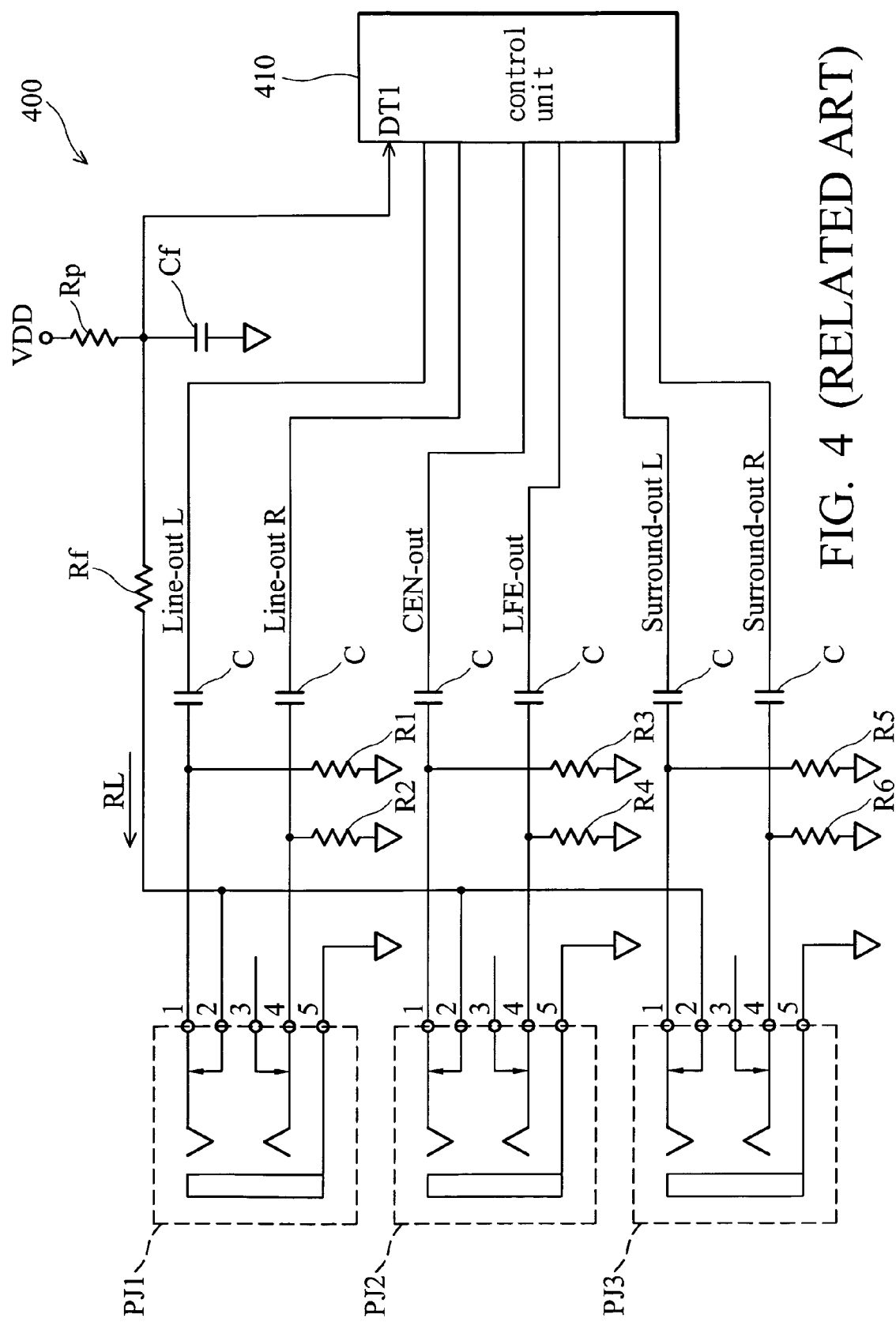
FIG. 4 shows a schematic diagram of a fourth related button device.
Figure 5:
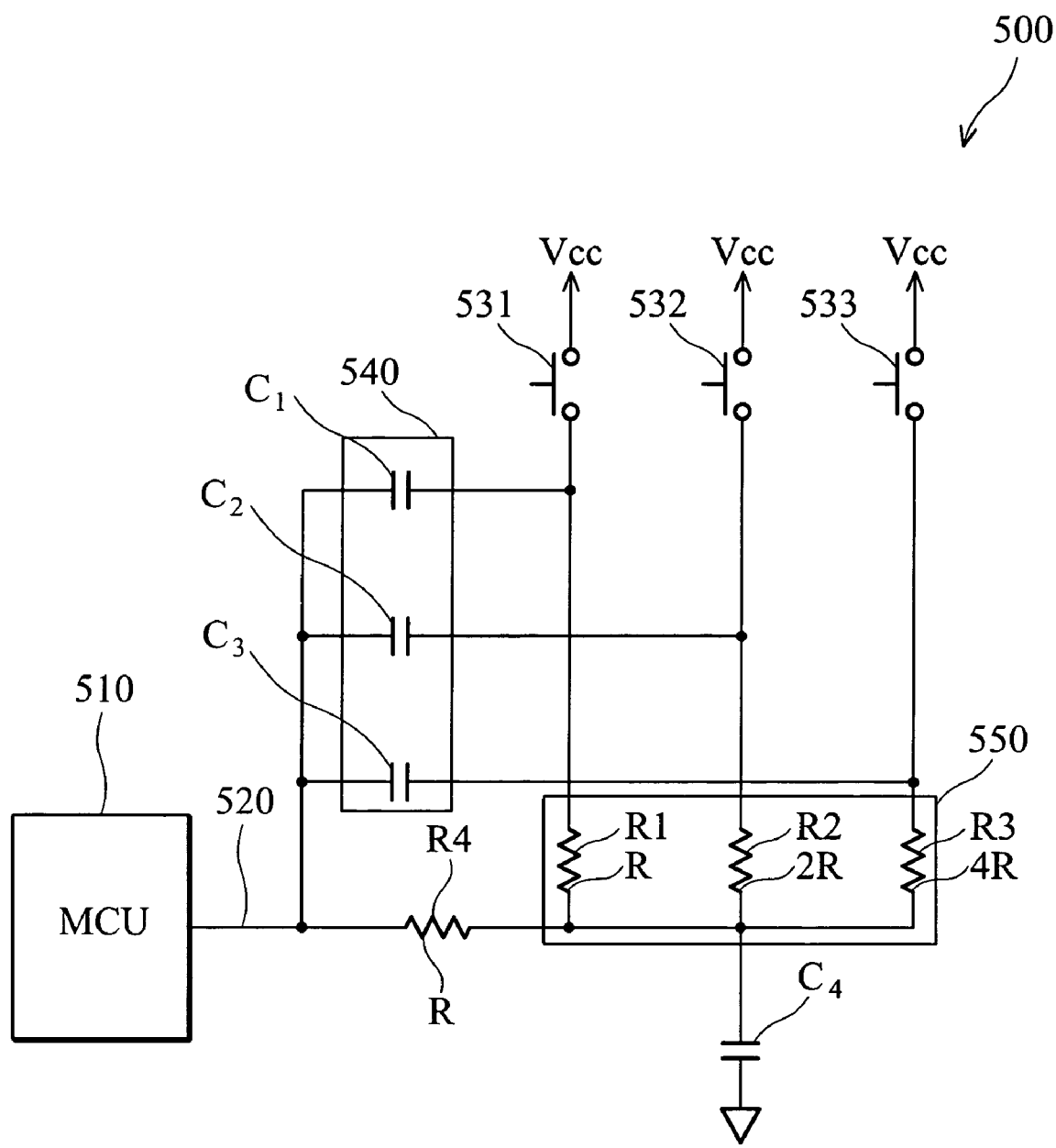
FIG. 5 shows a block diagram of a button device according to an embodiment of the invention.

Please refer to FIG. 5. FIG. 5 shows an embodiment of a block diagram of a button device 500. The button device 500 comprises a MCU 510, a voltage source Vcc, a plurality of buttons 531, 532 and 533, a pin 520, a control module 540, a charging module 550, a loading capacitor C4, and a discharging resistor R4. The charging module 550 comprises charging resistors R1, R2 and R3, respectively coupled to the buttons 531, 532 and 533, for providing different charging paths from the voltage source Vcc to the loading capacitor C4. The control module 540 comprises a plurality of control capacitors C1, C2 and C3, respectively coupled to the buttons 531, 532, 533 and the charging resistors R, R2, and R3. The resistances of the charging resistors R1, R2, R3, and R4 are R, 2R, 4R, and R, respectively. The capacitances of the control capacitors C1, C2 and C3 are the same predetermined constants. Please note that the pin 520 is a general input/output (GIO) pin. The invention, however, does not take the type of pin as a limitation. A detailed description of each element in the button device 500 is provided in the following.

Figure 6:
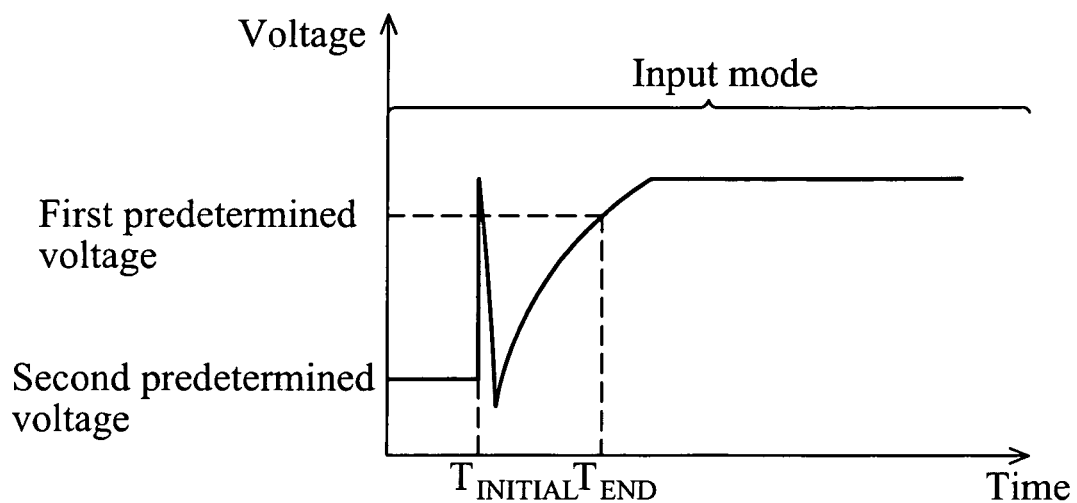
FIG. 6 shows a timing diagram of the voltage for the pin.

Please refer to FIG. 5 and FIG. 6 at the same time. FIG. 6 shows a timing diagram of the voltage for the pin 520 when any button is pressed to charge the loading capacitor C4. For example, at time $T_{INITIAL}$, the button 531 is pressed to generate a control signal. The connected control capacitor C1 then sends the control signal to the MCU 510 to generate an interrupt through the pin 520. The logic value of MCU 510 at this time is set to the logic value "0". The charging path through the charging resistor R1 starts to charge the loading capacitor C4 to generate a charged signal. An interrupt is sent to the MCU 510 and the MCU 510 starts to calculate the charging time. At time $T_{END}$, the voltage of the loading capacitor reaches a first predetermined voltage and the MCU stops calculating. The logic value of MCU 510 turns from the logic values "0" to "1" at this time and the MCU detects that a button is pressed. The MCU calculates the charging time to detect that the button 531 is pressed. From FIG. 5 and FIG. 6, the charging time (=$T_{END}-T_{INITIAL}$) calculated by the MCU 510 is equal to RC (the resistance R of the charging resistor R1 multiplied by the capacitance C of the loading capacitor C4). Similarly, if the button 532 is pressed, the charging time calculated by the MCU 510 is equal to 2RC. If the button 533 is pressed, the charging time calculated by the MCU 510 is equal to 4RC. If the charging time calculated by the MCU 510 is close (not equal) to RC, the button device 500 also can detect that the button 531 is pressed. Similarly, if the charging time calculated by the MCU 510 is close to 2RC, the button device 500 also can detect that the button 532 is pressed. If the charging time calculated by the MCU 510 is close to 4RC, the button device 500 also can detect that the button 533 is pressed.

Additionally, the button device can also detect more than two buttons pressed at the same time according to the charging time. Please refer to FIG. 5. For example, assume that the resistances of the charging resistors R1 and R2 are R and 2R, respectively. If the buttons 531 and 532 are pressed at the same time, the total resistance of the charging resistors R1 and R2 is equal to ⅔R (shunt value of R and 2R). Hence, the MCU calculates the charging time equal to ⅔RC and detects that the buttons 531 and 532 are pressed at the same time.

Ideally, the charging time calculated by the MCU 510 is almost equal to the charging resistance multiplied by the loading capacitance. In practice, due to the inaccurate element values, the ideal loading capacitance may be different from the real loading capacitance. If the button device 500 can adjust the loading capacitance before detecting buttons, the charging time calculated by the MCU 510 will be almost equal to the element value. A detailed description of adjusting the loading capacitor by coupling a discharging resistor to provide a discharging path is provided in the following.

Figure 7:
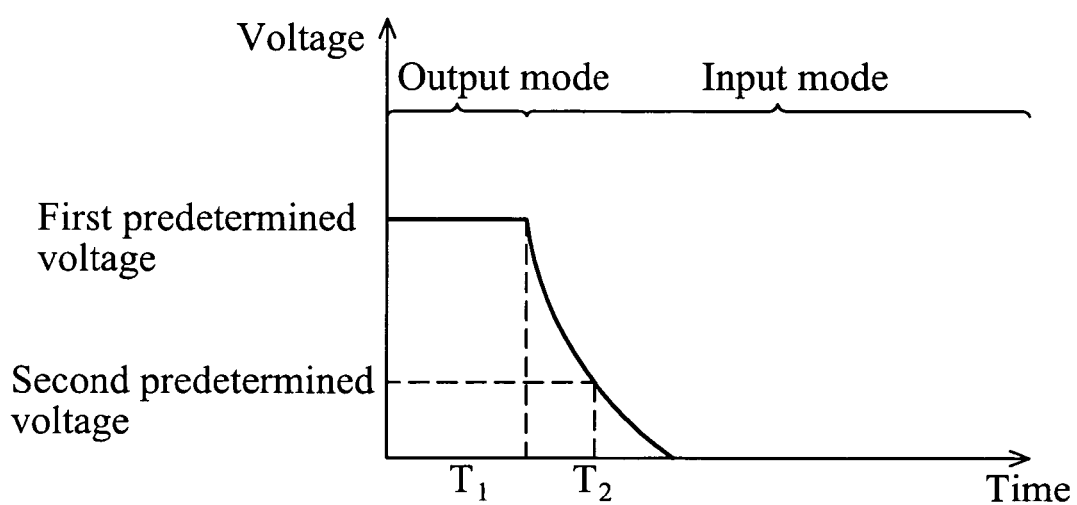
FIG. 7 shows another timing diagram of the voltage for the pin.

Please refer to FIG. 5 and FIG. 7 at the same time. FIG. 7 shows a timing diagram of the voltage for the pin 520 when the loading capacitor is adjusted. The pin 520 is initially set to output mode and the MCU 510 charges the loading capacitor through the discharging path provided by the discharging resistor R4. At time $T_1$, the voltage of the loading capacitor is charged to reach the first predetermined voltage. At this time, the logic value of the MCU 510 is equal to one and the pin 520 is switched to input mode to start discharging to adjust the loading capacitance. When discharging, the loading capacitor discharges through the discharging path provided by the discharging resistor R4 and the MCU 510 starts to calculate the discharging time. At time $T_2$, the voltage of the loading capacitor discharges to a second predetermined voltage and the logic value changes from "1" to "0". Then the MCU 510 stops calculating the charging time. The calculated charging time ($T_2-T_1$) corresponds to the discharging resistance R multiplied by the loading capacitance C. The real capacitance C of the loading capacitor is thus equal to the charging time ($T_2-T_1$) divided by the discharging resistance R. The real capacitance C can be utilized to adjust the inaccuracy of initial element value and time range. Please note that when adjusting the loading capacitance, the MCU 510 must temporarily stop detecting buttons until the adjustment is complete.

Compared with the related art, the button device of the invention does not require a huge number of pins to detect buttons. Additionally, expensive elements (e.g. ADC) are not necessary. Hence, the button device of the invention can provide more design flexibility and decrease costs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A button device comprising a voltage source and a plurality of buttons, said voltage source is connected to a terminal of each button for providing electric power, the button device comprising:

a charging module comprising a plurality of charging resistors respectively coupled to another terminal of each button for providing a plurality of charging paths, wherein at least one charging path is connected when at least one button is pressed;

a loading capacitor coupled to the charging module for obtaining the electric power from the connected charging path to generate a charged signal;

a control module comprising a plurality of control capacitors respectively coupled to another terminal of each button and a terminal of each charging resistor for sending a control signal through a connected control capacitor when the button is pressed to generate the control signal;

a micro controller unit (MCU) coupled to the control module and the charging module for receiving the control signal to calculate a charging time and determining which button is pressed according to the charging time;

wherein the control module is coupled to a general input/ output (GIO) pin of the MCU, the GIO pin is in an input mode, and the MCU receives an interrupt through the GIO pin to calculate the charging time when the control signal is generated and the MCU stops calculating the charging time when the charged signal reaches a first predetermined voltage, and wherein each charging resistor has a different resistance corresponding to a different charging time;

the button number, the charging resistor number, and the control capacitor number are equal to three;

the resistance of a first, second, third charging resistors of the charging module are respectively equal to R, 2R, and 4R, wherein R is a constant;

the capacitance of the loading capacitor is equal to C, wherein C is a constant; and a first, second, and third buttons corresponding to different charging path are respectively equal to RC, 2RC, and 4RC.

2. The button device as claimed in claim 1, wherein if the charging time calculated by the MCU is equal to RC, the MCU detects that the first button is pressed; if the charging time calculated by the MCU is equal to 2RC, the MCU detects that the second button is pressed; if the charging time calculated by the MCU is equal to 4RC, the MCU detects that the third button is pressed.

3. The button device as claimed in claim 1, wherein the button device further comprises:

a discharging resistor coupled to the loading capacitor and the MCU for providing a discharging path from the MCU to the loading capacitor;

wherein the MCU stops detecting buttons when the discharging path is effective; during the effective discharging path, the GIO pin is set to output mode and the MCU provides elector power to charge the loading capacitor to the first predetermined voltage, then the GIO pin is set to input mode and the loading capacitor discharges to a second predetermined voltage to calculate a discharging time through the discharging path, and finally the capacitance of the loading capacitor is estimated according to the discharging time.

4. The button device as claimed in claim 3, wherein the MCU adjusts the charging time ranges of each charging path corresponding to the buttons according to the discharging time.

5. A method of detecting buttons in a button device, said button device comprising a micro controller unit (MCU), a plurality of buttons, and a voltage source, the method:

providing a plurality of charging paths corresponding to the plurality of buttons;

when at least one button is pressed, charging from at least one charging path corresponding to the pressed buttons to generate a charged signal, generating a control signal to control the micro controller unit (MCU) to calculate a charging time, wherein an interrupt is generated when the control signal is generated, the MCU starts to calculate the charging time of the charged signal, and the micro controller unit (MCU) stops calculating the charging time when the charged signal reaches a first predetermined voltage;

determining which button is pressed according to the charging time;

wherein different charging paths corresponds to different charging times;

the plurality of buttons comprises a first, second, and third buttons, and the charging times of the first, second, and third buttons are respectively equal to a first, second, and third predetermined time;

if the charging time calculated by the MCU is equal to the first predetermined time, the MCU detects that the first button is pressed;

if the charging time calculated by the MCU is equal to the second predetermined time, the MCU detects that the second button is pressed; and if the charging time calculated by the MCU is equal to the third predetermined time, the MCU detects that the third button is pressed.

6. The method as claimed in claim 5 further comprises a discharging path for calculating a discharging time discharged from the first predetermined voltage to the second predetermined voltage, wherein the button device stops detecting buttons and adjusts charging time ranges of each charging path corresponding to the buttons according to the discharging time.

* * * * *